United States Patent [19]

Heidt

[11] 4,167,030
[45] Sep. 4, 1979

[54] PROTECTIVE CIRCUIT FOR AN ELECTRONIC SWITCHING AMPLIFIER IN SERIES WITH AN ELECTROMAGNET

[75] Inventor: Alfred Heidt, Schwetzingen, Fed. Rep. of Germany

[73] Assignee: Frankl & Kirchner GmbH & Co. KG, Schwetzingen, Fed. Rep. of Germany

[21] Appl. No.: 924,902

[22] Filed: Jul. 14, 1978

[30] Foreign Application Priority Data

Jul. 19, 1977 [DE] Fed. Rep. of Germany ....... 2732512

[51] Int. Cl.² ............................................ H01H 47/32
[52] U.S. Cl. .................................... 361/154; 361/159; 361/194
[58] Field of Search ................. 361/152, 154, 159, 194

[56] References Cited

U.S. PATENT DOCUMENTS

| | | | |
|---|---|---|---|
| 3,211,117 | 10/1965 | Spekhermann et al. | 361/154 |
| 3,579,052 | 5/1971 | Kato et. al. | 361/154 |
| 3,790,862 | 2/1974 | Kampf et al. | 361/152 |
| 3,864,608 | 2/1975 | Normile et al. | 361/194 X |
| 3,870,931 | 3/1975 | Myers | 361/194 |
| 3,909,681 | 9/1975 | Campari et al. | 361/154 |
| 4,041,546 | 8/1977 | Stewart | 361/152 |
| 4,142,684 | 3/1979 | Schweitzer | 361/152 X |

FOREIGN PATENT DOCUMENTS 2049179 2/1976 Fed. Rep. of Germany .

*Primary Examiner*—Harry E. Moose, Jr.
*Attorney, Agent, or Firm*—Browdy and Neimark

[57] ABSTRACT

A protective circuit for an electronic switching amplifier is controlled by an operating switch, the amplifier serving to turn on an electromagnet with timed pulses during its operating interval. The electromagnet may electromagnetically actuate positioning and actuating elements on sewing machines and the like, with the timed pulses. A cutoff voltage limiting circuit is connected on one side between the electromagnet and the switching amplifier. A free-running diode is connected in parallel with the electromagnet through an electronic switch as an additional cutoff voltage limiting circuit. The electronic switch is caused to conduct by the switching amplifier during the operating interval, at least during the decay of the timing pulses. The electronic switch is blocked when the operating interval is terminated by the operating switch. The cutoff voltage limiting circuit is designed to conduct when electronic switch is blocked.

3 Claims, 2 Drawing Figures

PROTECTIVE CIRCUIT FOR AN ELECTRONIC SWITCHING AMPLIFIER IN SERIES WITH AN ELECTROMAGNET

BACKGROUND OF THE INVENTION

This invention relates to a protective circuit which includes an electronic switching amplifier in operative association with an electromagnet.

The invention relates more particularly to such a circuit having an amplifier which turns on the electromagnet with timing pulses, a cutoff voltage limiting circuit being connected between the amplifier and voltage limiting circuit.

Electromagnetically actuated positioning and actuating elements are frequently provided on industrial sewing machines for semi-automatic operation, for the initiation, performance, or termination of certain automated work steps; for example as described in U.S. Pat. No. 3,211,117 for electromagnetically actuated thread cutters on sewing machines. Moreover, the actuation of electromechanical devices of other types, in machine tools or assembly lines for example, is often accomplished electromechanically. In other words, an electrically or electronically controllable electromagnet is used as a positioning element in various applications.

It is known to control such electromagnets by providing continuous holding energization during the switched-on interval of the electromagnet by using timing pulses. A mean effective energization is produced in such holding energization by timing pulses as a function of the predetermined pulse duty factor and the given amplitude. However, in order to energize the electromagnet rapidly, the latter is overenergized briefly at the start of operation by applying the supply voltage continuously at the above mentioned constant amplitude over a certain period of time and thereafter switching over to continuous operation with timing pulses; in other words the holding operation is affected with reduced magnet energization, only after the electromagnet has initially responded.

The problem is that during this continuous pulsed operation, periodic cutoff voltages appear during the interval that the electromagnet is connected to the switching amplifier, which is connected in series with the electromagnet. This is known to increase directly with the steepness of the switching characteristic of the switching amplifier as it shuts off. On the other hand, it is desirable to produce a switching characteristic which is sufficiently steep to be able to bypass the switching amplifier with ideal switching operation, practically avoiding the appearance of internal power losses. In order to prevent the quite considerable cutoff voltage peaks which appear periodically from breaking through the high-resistance collector-emitter path of the open switching amplifier, it is conventional to use cutoff voltage limiting circuits as protective circuits. The effect of these protective circuits is to limit the voltage peaks to the blocking voltage which is permissible depending on the individual switching amplifier. Cutoff voltage limiter circuits of this type consist as a rule either of a feedback path from the collector to the base of the input transistor of the switching amplifier via a Zener diode which is, as a rule, in the form of a Darlington circuit, or of a series circuit connected in parallel with the winding of the electromagnet, the series circuit being composed of a free-running diode and a series resistor.

The first of these conventionally employed limiting circuits, wherein the forward voltage of the Zener diode (which in practice is further connected in series with a reference voltage diode) depending on the permissible blocking voltage for the switching amplifier, has the disadvantage that when this permissible blocking voltage is exceeded by the cutoff voltage peaks, the switching amplifier is temporarily driven in the forward direction. It then consequently operates in an unfavorable power loss range of its characteristic, the energy must be dissipated in the cutoff process being converted to heat losses. Especially in modern commercial Darlington circuits provided with plastic housings, these cutoff heat losses can cause the destruction of this transistorized circuit, which constitutes the switching amplifier.

The second alternative for conventionally employed limiting circuits, wherein the cutoff voltage peaks are practically shortcircuited through the free-running diode, has the disadvantage that the series resistor which determines the response threshhold converts all of the energy into heat losses, so that, especially in circuits constructed in tight spaces, inadmissible radiated heat losses will be generated by this resistor.

German Auslegeschrift (Published Patent Application) No. 2,049,179 teaches a protective circuit for a reversible drive motor, whose armature circuit is connected in parallel through the reversing switch to a free-running diode in the form of a controllable electronic valve (switch). In order to eliminate electrical and mechanical overloads on the drive motor in the event of inadmissible actuation of the reversing switch, especially when the motor is disconnected from the line, in such manner that this valve (switch) will be opened no earlier than at this particular time.

SUMMARY OF THE INVENTION

In view of the fact that the development of heat losses as a function of cutoff voltage is to be avoided in the vicinity of the protective circuit, in the case of a pure free-running diode without a series resistor, and yet this causes a considerable delay in dropout and hence a rapid shutoff of the electromagnet at the end of operation, it is the principal object of the present invention to improve upon a protective circuit of the type described hereinabove so that no inadmissible cutoff-voltage-dependent heat losses develop in the protective circuit during continuous pulsed operation, while additionally at the end of the operating interval of the electromagnet, a delay in de-energization is avoided in the interest of an effective rapid shutoff of the electromagnet.

The foregoing object, as well as others which are to become apparent from the text below, is achieved in a protective circuit for an electronic amplifier controlled by an operating switch, the amplifier serving to turn on an electromagnet with timed pulses during its operating interval. A cutoff voltage limiting circuit is connected on one side between the electromagnet and the switching amplifier. A free-running diode according to the invention is connected in parallel with the electromagnet through an electronic switch as an additional cutoff voltage limiting circuit. The electronic switch is caused to conduct by the switch amplifier during the operating interval, at least during the decay of the timing pulses. The electronic switch is blocked when the operating interval is terminated by the operating switch. The cutoff voltage limiting circuit is designed to conduct when electronic switch is blocked.

The electromagnet may be operatively associated with positioning or actuating elements on sewing machines and the like.

The solution according to the present invention ensures that during continuous timing pulse operation, in other words during the operating interval, with a periodically connected electromagnet, the free-running diode is connected directly in parallel with the energizing winding of the electromagnet, in other words, the periodic cutoff voltage peaks are directly short-circuited without causing significant development of heat losses in the switching amplifier itself or in the protective circuit. The perceptibly increased cutoff delay for the electromagnet, caused by this direct parallel connection of the free-running diode, constitutes an advantageous side effect, because it results in an improvement of the characteristic of quasi-continuous operation with holding energization during the operating interval. Because, however, at the end of the operating interval the above-mentioned direct paralled connection of the electromagnet and the free-running diode is eliminated, on the one hand, there is no delay in the dropout of the electromagnet, and the single increased cutoff voltage peak which appears instead, on the other hand, namely at the end of operation, is limited to a negligible value by one of the above-mentioned conventional cutoff voltage limiting circuits so that it does not impair the function of the switching amplifier, without the power loss which appears once in the switching amplifier, or in the vicinity of the protective circuit in the case of a diode series resistance, producing perceptible heating.

Advantageously, the switching section of a bidirectional thyristor (triac) can be used as the electronic switch. Its gate, through the closed operating switch, in other words, during continuous pulsed operation of the electromagnet, is biased for periodic ignition with periodic disconnection of the switching amplifier. In other words, when the operating switch is closed, the continuous gate control is set so that when the cutoff voltage appears periodically, the switching section of the triac conducts and then connects the free-running diode through this low-resistance switching section directly in parallel with the electromagnet. In this manner, the increased cutoff voltage is rapidly broken down and the triac discharges again. At the end of operation, on the other hand, in other words when the operating switch is open, the gate of the triac is no longer biased for conducting in the switching connection, in other words, when the electromagnet is shut off, the switch in the form of the triac is no longer closed, there is no direct parallel connection of the electromagnet and the free-running diode, and hence the dropout delay, which is advantageous for continuous operation, but is disadvantageous for rapid shutoff at the end of operation, does not occur.

If the operating switch, at a specified end of operation, is open at a given moment with the desired rapid de-energization of the electromagnet, since the triac is a low-resistance conducting section, and the free-running diode is connected in parallel with the electromagnet, this prevents the desired rapid deenergization because a triac is only shut off again by virtue of the fact that the load current through the switching section is interrupted. In order to be able to ensure rapid shutoff even at such unfavorable times for opening the operating switch, according to an advantageous improvement of the invention, a provision is made to initiate a brief pulsed control of the switching amplifier when the operating switch opens. This ensures that the switching amplifier, if it had a high resistance during pulsed operation, is now short-circuited and allows the difference in potential across the anode terminals of the triac to collapse rapidly, with the result that the triac, if it has just conducted, has a high resistance at this point at the end of operation, and hence disconnects the parallel connection between the free-running diode and the electromagnet. At the end of this pulsed control of the switching amplifier, the triac is not made conducting again, because now the operating switch is opened, and the triac gate is therefore not biased for conducting in the triac switching section.

BRIEF DESCRIPTION OF THE DRAWINGS

Further features and advantages of the invention are to become apparent from the text below and the diagrams of a preferred electronic embodiment of a protective circuit according to the invention, as well as a variant thereof.

DESCRIPTION OF THE PREFERRED EMBODIMENT

Figure 1:
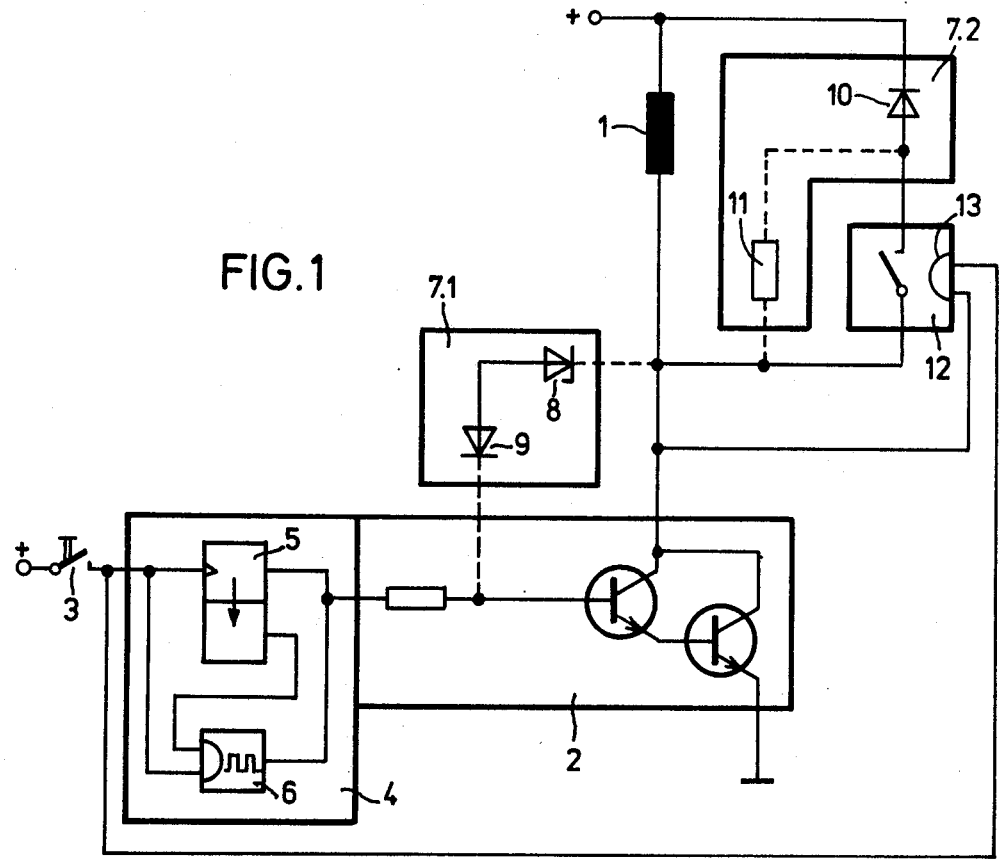
FIG. 1 is a schematic diagram of two embodiments of a protective circuit according to the invention, with its electronic switch being associated with a free-running diode, controlled as a function of the operation of a switching amplifier.

In the schematic diagram shown in FIG. 1, which has been reduced to its essentials, the energizing winding of an electromagnet 1 is connected in series between a positive supply voltage and ground via an electronic switching amplifier 2. The amplifier 2 is a transistor circuit. The collector-emitter switching section of the switching amplifier, shown in a Darlington circuit, has low resistance, so that switching amplifier 2 is caused to conduct when the base of the input transistor is driven with operating a switch 3 closed. The operating switch 3 can be for example an electromechanical or electronic switch controlled manually or via an automatic control device. Actuation, in other words closing of the operating switch 3, energizes the electromagnet 1 to exert a force upon an electromagnetically actuated positioning or actuating element, for example the thread cutter on a sewing machine.

In order for a single operating voltage to suffice, for the purpose of rapidly energizing the electromagnet 1 at the moment that the operating switch 3 is closed, the total operating voltage is temporarily applied to the electromagnet 1, and thereafter a switch is made to intermittent or pulsed operation under the influence of a reduced excitation adjusted to the pulse duty factor for so-called holding energization. For this purpose, an electronic switch 4 is provided between the operating switch 3 and the switching amplifier 2, the switch 4 being either a separate unit or a component of the switching amplifier circuit 2. This switch 4 as shown comprises a monostable reversing state 5, which causes the switching amplifier 2 to conduct for an initial period under the influence of the operating switch 3 until it drops back into its stable switching mode after its time constant has expired. A second output from the reversing stage 5 then enables an astable multivibrator 6 connected in series with it, as long as the operating switch 3 remains closed. Hence, the switching amplifier 2 is driven periodically, depending on the pulse duty factor (the pulse duration divided by the pulse spacing) by timing pulses constituting the output signal of the multivibrator 6.

It is known from electronics that when an electromagnet 1 is disconnected, its selfinductance will generate a cutoff voltage peak at the magnet-side terminal of the circuit, which must be reliably blocked from the opening and opened switching section, in this example, from the Darlington collector-emitter section of switching amplifier 2, in order to prevent a situation in which, at the end of operation, additional exciting current flows through the electromagnet 1; this would prevent rapid de-energization of the electromagnet 1 at the end of operation and could also lead to the distruction of the switching amplifier 2.

In order to avoid voltage arcing caused by cutoff voltage peaks in the switching amplifier 2, it is conventional to provide cutoff voltage limiting circuits, of which the two most important embodiments are shown in FIG. 1. The first alternative illustrated generally at numeral 7.1, for a limiting circuit of this kind consists essentially of a feedback in the form of a Zener diode 8 connected between the collector and base of the input transistor of the switching amplifier 2, a bias diode 9 being connected in series with the Zener diode as a general rule. The breakdown voltage of Zener diode 8 is selected appropriately for the admissible blocking voltage for the switching amplifier 2, i.e., if this admissible blocking voltage is exceeded as the result of the appearance of a cutoff voltage pulse, the Zener diode 8 will conduct and, by allowing current to flow into the base of the input transistor of the switching amplifier 2, the latter is driven so that the otherwise harmful cutoff voltage is dissipated by being converted into heat losses.

The second alternative for the limiting circuit, illustrated generally at numeral 7.2, consists of a series connection of a free-running diode 10 with a series resistor 11, this series circuit is connected in parallel with the electromagnet 1. The free-running diode 10 is polarized in the forward direction for the cutoff voltage peaks, so that it can be short-circuited through the above-mentioned limiting circuit 7.2 according to the second alternative. The series resistor 11 serves at least partially to compensate for the resultant dropout delay of the electromagnet 1 at the end of operation, and the series resistance 11 is dimensioned in such manner that no cutoff voltage level which is critical for the switching amplifier 2 is produced because of the voltage drop across it. However, the voltage drop across the series resistor 11 results in the latter's being heated considerably or to a point which is no longer admissible as a result of heat radiation under certain conditions, since the cutoff voltage peaks follow one another in rapid succession during continuous operation of the electromagnet 1.

In order to avoid inadmissible cutoff voltage peaks on the one hand and undesirable heat losses on the other, the protective circuit according to the invention always provides a free-running diode 10 which is directly connectable in parallel with the electromagnet 1 through an electronic switch 12. This electronic switch 12 is enabled by the switching amplifier 2, as shown symbolically in FIG. 1 by the connection of a control input 13, in such manner that it is closed during the continuous operation of the electromagnet 1, but at least at the end of the pulse of the timing control from the multivibrator 6. In other words, during continuous operation of the electromagnet 1, the free-running diode 10 is connected directly in parallel with the electromagnet 1 each time the latter is disconnected, and the total cutoff voltage is directly short-circuited without stressing or damaging the switching amplifier 2. The resultant increase in dropout delay is favorable, since the purpose of the periodic control of the electromagnet 1 during continuous operation is to drive the electromagnet 1 continuously with a holding energization which is reduced as a function of the mean value of the periodic control of the switching amplifier 2. A limiting circuit, which is connected under certain conditions, according either to the first alternative 7.1 or to the second alternative 7.2 (i.e., adding the series resistor 11 to free-running diode 10) has no effect, since the cutoff voltage peaks are short-circuited directly through the closed electronic switch 12 and the free-running diode 10.

However, if at the end of the operation, the operating switch 3 is reopened, so that a considerable dropout delay would cause a problem, the electronic switch 12 is no longer closed as a result of modified control of control input 13, i.e., there is no direct parallel connection any longer between the free-running diode 10 and the electromagnet 1. Instead, the limiting circuit 7.1 or 7.2 in the alternative which is provided in the specific application shown, is effective preferably in the first alternative 7.1, in other words, once only at the end of operation, is there a breakdown of the cutoff voltage by conversion into heat losses without this resulting in an inadmissible heating of the active components of the switching amplifier 2 or possibly the series resistor 11.

Figure 2:
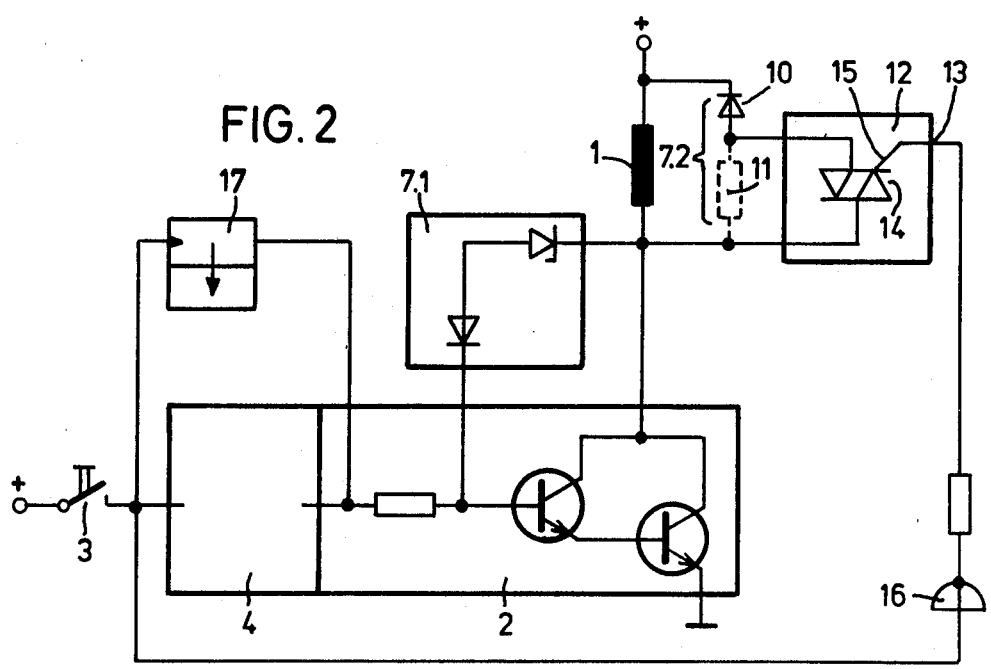
FIG. 2 is a schematic diagram of a protective circuit according to a variant of the circuit of FIG. 1, wherein the electronic switch is in the form of a triac.

Since current flows through the electronic switch 12 only in the forward direction of the free-running diode 10, namely, in order to short-circuit the unipolar, periodically appearing cutoff voltage peaks during continuous operation with holding energization, a thyristor could quite readily be used as a controlled electronic switch. However, the cathode side would remain practically at supply voltage potential, in other words a positive voltage would have to be made available at its gate in order to allow the thyristor to conduct. In order to avoid the cost associated with circuits for producing such a supply voltage, which in the example shown would be opposite to the positive supply voltage, a solution according to the invention for a preferred variant, as shown in FIG. 2, provides for the use of a so-called bidirectional thyristor or triac 14 to act as the controllable electronic switch 12, because this component can conduct in the second quadrant of the current-voltage characteristic. The control input 13 shown symbolically in FIG. 1 is therefore formed by the triac gate 15 in the variant shown in FIG. 2. Since it is provided in the embodiment shown that the operating switch 3 is also connected to the positive supply voltage, an inverter circuit 16 is provided between the latter and the gate 15. Thus, the gate 15 is at a lower potential when the operating switch 3 is closed for continuous operation of the electromagnet 1 with the holding energization, than the reference anode of the triac 14, so that the latter can conduct in the second quadrant of the characteristic.

When the operating switch 3 is closed, the gate 15 is biased so that triac 14 conducts before the cutoff voltage has reached a typical value on the magnet-side connection of the switching amplifier 2; in other words, during continuous pulsed operation of the electromagnet 1, the electronic switch 12 again conducts periodically while the switching section of the triac 14 conducts when cutoff voltage pulses appear and the free-running diode 10 is always connected directly in parallel with the electromagnet 1 in order to short-circuit these cutoff voltage peaks.

At the end of operation, on the other hand, in other words when the operating switch 3 is reopened, control over the gate 15 is suspended. In other words, when the last cutoff voltage pulse appears, there is no direct short circuit through the free-running diode 10, so that limiting circuit (as in first alternative 7.1) is effective only once.

In order to ensure that rapid de-energization of the electromagnet 1 occurs when the operating switch 3 is opened even if the triac 14 has just conducted, it is advantageous according to another variant of the invention to provide a pulse source 17, in the form of a monostable reversing stage. When the control voltage disappears as a result of opening the operating switch, the latter is dynamically excited and produces a single short pulse control for the electronic switching amplifier 2. This ensures that the triac 14, if it has just conducted at this moment, is discharged and the dropout delay is eliminated by disconnecting the free-running diode 10; instead, the limiting circuit, either in first alternative (7.1) with diode feedback to switching amplifier 2, or in second alternative (7.2) with series resistor 11 in series with free-running diode 10, is effective.

What is claimed is:

1. In a protective circuit for an electronic switching amplifier controllable through an operating switch, the amplifier turning on an electromagnet by supplying current to its winding during an operating interval with timed pulses, a cutoff voltage limiting circuit being connected on one side between the electromagnet and the switching amplifier, the improvement comprising a free-running diode connected in parallel with said winding of said electromagnet via an electronic switch as an additional cutoff voltage limiting circuit, said electronic switch being coupled to said switching amplifier and responsive to an output therefrom during the operating interval, at least during decay of the timing pulses, said electronic switch being blocked when the operating interval is terminated by said operating switch, and said cutoff voltage limiting circuit being conductive when said electronic switch is blocked.

2. An improved protective circuit according to claim 1, wherein said electronic switch is a switching section of a triac, whose gate is biased via said operating switch when closed during the operating interval for periodic ignition with periodic shutoff of said switching amplifier, a pulse source being provided, which delivers a short operating pulse to said switching amplifier when said operating switch opens.

3. An improved protective circuit according to claim 2, including an inverter circuit provided between said gate of said triac and said operating switch, said operating switch when closed feeding a voltage to said inverter which is substantially equal to the supply voltage for said electromagnet.

* * * * *